United States Patent
Lee et al.

(10) Patent No.: US 12,557,264 B2
(45) Date of Patent: Feb. 17, 2026

(54) SEMICONDUCTOR DEVICES

(71) Applicant: Samsung Electronics Co., Ltd., Suwon-si (KR)

(72) Inventors: Minjun Lee, Suwon-si (KR); Kijoon Kim, Suwon-si (KR); Yongseok Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 397 days.

(21) Appl. No.: 18/115,116

(22) Filed: Feb. 28, 2023

(65) Prior Publication Data

US 2023/0354580 A1  Nov. 2, 2023

(30) Foreign Application Priority Data

Apr. 27, 2022  (KR) .................. 10-2022-0051975

(51) Int. Cl.
*H10B 12/00* (2023.01)

(52) U.S. Cl.
CPC ............. *H10B 12/20* (2023.02); *H10B 12/01* (2023.02)

(58) Field of Classification Search
CPC ........ H10B 51/10; H10B 51/20; H10B 51/30; H10B 51/40; H10B 12/30; H10D 30/0415; H10D 30/701; G11C 11/2255; G11C 11/2257
See application file for complete search history.

(56) References Cited

U.S. PATENT DOCUMENTS

| | | |
|---|---|---|
| 7,969,808 B2 | 6/2011 | Song et al. |
| 8,134,202 B2 | 3/2012 | Tak et al. |
| 8,143,656 B2 | 3/2012 | Lee et al. |
| 9,559,216 B2 | 1/2017 | Banna et al. |
| 9,837,155 B1 | 12/2017 | Kim et al. |
| 10,643,699 B2 | 5/2020 | Kim et al. |
| 2006/0125121 A1 | 6/2006 | Ko et al. |
| 2011/0205816 A1 | 8/2011 | Son et al. |
| 2011/0221001 A1 | 9/2011 | Song et al. |
| 2019/0067325 A1* | 2/2019 | Yano .................. G11C 16/0466 |

(Continued)

FOREIGN PATENT DOCUMENTS

| | | |
|---|---|---|
| KR | 100894683 B1 | 4/2009 |
| KR | 20100055874 A | 5/2010 |

(Continued)

OTHER PUBLICATIONS

Office Action and Search Report dated Feb. 17, 2024 from the Taiwan Patent Office for corresponding Taiwan Patent Application No. 112110228.

*Primary Examiner* — Edward Chin
(74) *Attorney, Agent, or Firm* — Muir Patent Law, PLLC

(57) ABSTRACT

A semiconductor device includes a gate electrode on a substrate, a memory body structure extending through the gate electrode, a source layer at an end portion of the memory body structure and including germanium doped with p-type impurities, and a drain layer at another end portion of the memory body structure and including a metal or a metal alloy. The memory body structure may include a body including undoped polysilicon, a charge storage pattern on a sidewall of the body, and a blocking pattern on an outer sidewall of the charge storage pattern and contacting the gate electrode.

20 Claims, 21 Drawing Sheets

(56) References Cited

U.S. PATENT DOCUMENTS

2020/0335610 A1* 10/2020 Huang ............... H10D 30/6729
2020/0381453 A1   12/2020 Lee et al.
2022/0020774 A1    1/2022 Chia et al.
2024/0332418 A1* 10/2024 Chen ................... H10D 30/025

FOREIGN PATENT DOCUMENTS

| KR | 101461629 B1 | 11/2014 |
| KR | 101804666 B1 | 12/2017 |
| KR | 101896759 B1 | 9/2018 |
| KR | 102029196 B1 | 10/2019 |
| TW | 202203219 A | 1/2022 |

* cited by examiner

SEMICONDUCTOR DEVICES

CROSS-REFERENCE TO RELATED APPLICATION

This application claims priority under 35 U.S.C. § 119 to Korean Patent Application No. 10-2022-0051975, filed on Apr. 27, 2022 in the Korean Intellectual Property Office (KIPO), the disclosure of which is incorporated by reference herein in its entirety.

TECHNICAL FIELD

Example embodiments of the inventive concept relate to a semiconductor device. Particularly, example embodiments of the inventive concept relate to a 1T-DRAM including a tunnel field effect transistor (TFET).

Discussion of Related Art

In a conventional 1T-DRAM based on a TFET, an on-current is low so that a ratio of an on-current with respect to an off-current is low, which may cause a low sensing margin. Additionally, an I-V curve between a gate voltage and a drain current is ambipolar, and thus a sensing margin is low due to the disturbance between cells.

SUMMARY

Example embodiments of the inventive concept provide a semiconductor device having enhanced electric characteristics.

According to example embodiments of the inventive concept, a semiconductor device includes a gate electrode on a substrate, a memory body structure extending through the gate electrode, a source layer at an end portion of the memory body structure, and a drain layer at another end portion of the memory body structure. The memory body structure includes a body, a charge storage pattern, and a blocking pattern on an outer sidewall of the charge storage pattern, the blocking pattern contacting the gate electrode. The source layer includes a buried portion buried in the body. A portion of the body is interposed between the buried portion of the source layer and the charge storage pattern.

According to example embodiments of the inventive concept, a semiconductor device includes a gate electrode on a substrate, a memory body structure extending through the gate electrode, a source layer at an end portion of the memory body structure, the source layer including germanium doped with p-type impurities, and a drain layer at another end portion of the memory body structure, the drain layer including a metal or a metal alloy. The memory body structure includes a body including undoped polysilicon, a charge storage pattern on a sidewall of the body, and a blocking pattern on an outer sidewall of the charge storage pattern, the blocking pattern contacting the gate electrode.

According to example embodiments of the inventive concept, a semiconductor device includes a plurality of bit lines on a substrate, each bit line of the plurality of bit lines extending in a first direction substantially parallel to an upper surface of the substrate, and the plurality of bit lines being spaced apart from each other in a second direction substantially parallel to the upper surface of the substrate and crossing the first direction, a plurality of gate electrodes spaced apart from each other in the first direction on the plurality of bit lines, each gate electrode of the plurality of gate electrodes extending in the second direction, a plurality of source lines spaced apart from each other in the second direction on the plurality of gate electrodes, each source line of the plurality of source lines extending in the first direction, a plurality of memory body structures spaced apart from each other in the second direction, each memory body structure of the plurality of memory body structures extending through a corresponding gate electrode of the plurality of gate electrodes in a third direction substantially perpendicular to the upper surface of the substrate, a plurality of source layers at first end portions of the plurality of memory body structures, respectively, each source layer of the plurality of source layers contacting a corresponding source line of the plurality of source lines, and a plurality of drain layers at second end portions of the plurality of memory body structures, respectively, each drain layer of the plurality of drain layers contacting a corresponding bit line of the plurality of bit lines. Each memory body structure of the plurality of memory body structures includes a body extending in the third direction, a charge storage pattern on a sidewall of the body, and a blocking pattern on an outer sidewall of the charge storage pattern. Each source layer of the plurality of source layers includes a buried portion buried in an upper portion of a body of a corresponding memory body structure of the plurality of memory body structures. A portion of the body of the corresponding memory body structure is interposed between each of the plurality of source layers and the charge storage pattern on the sidewall of the body of the corresponding memory body structure of the plurality of memory body structures.

The semiconductor device may have enhanced on-current and operation speed, and increased sensing margin.

DETAILED DESCRIPTION OF THE EMBODIMENTS

The above and other features of the inventive concept will be more clearly understood by describing in detail exemplary embodiments thereof with reference to the accompanying drawings. Hereinafter, in the specification (and not necessarily in the claims), two directions substantially parallel to an upper surface of a substrate and crossing each other may be defined as first and second directions D1 and D2, respectively, and a direction substantially perpendicular to the upper surface of the substrate may be defined as a third direction D3. In example embodiments, the first and second directions D1 and D2 may be substantially perpendicular to each other.

Figure 1:
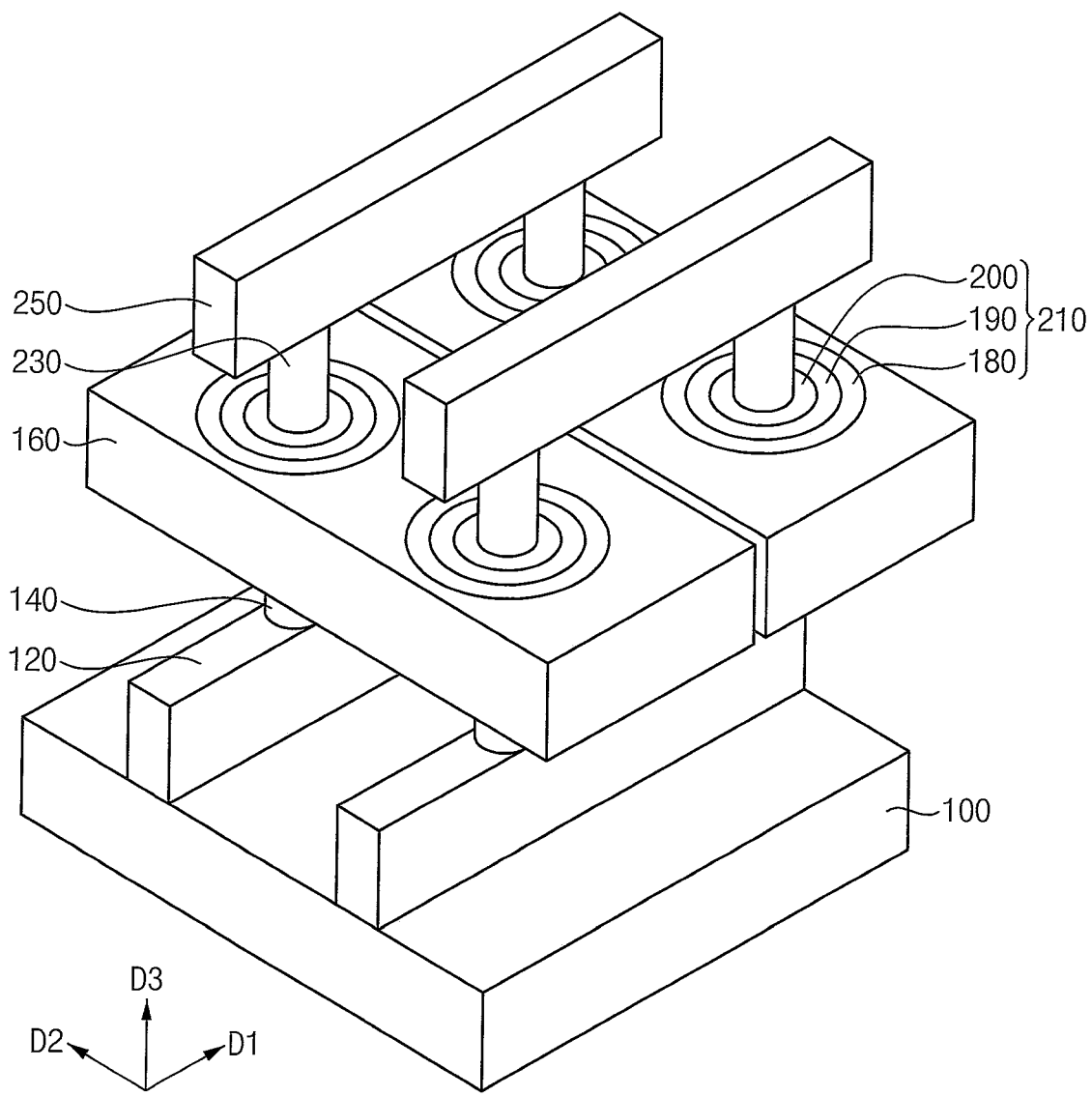
FIGS. 1 to 3 are a perspective view, a plan view and a cross-sectional view, respectively, illustrating a semiconductor device in accordance with example embodiments.
Figure 2:
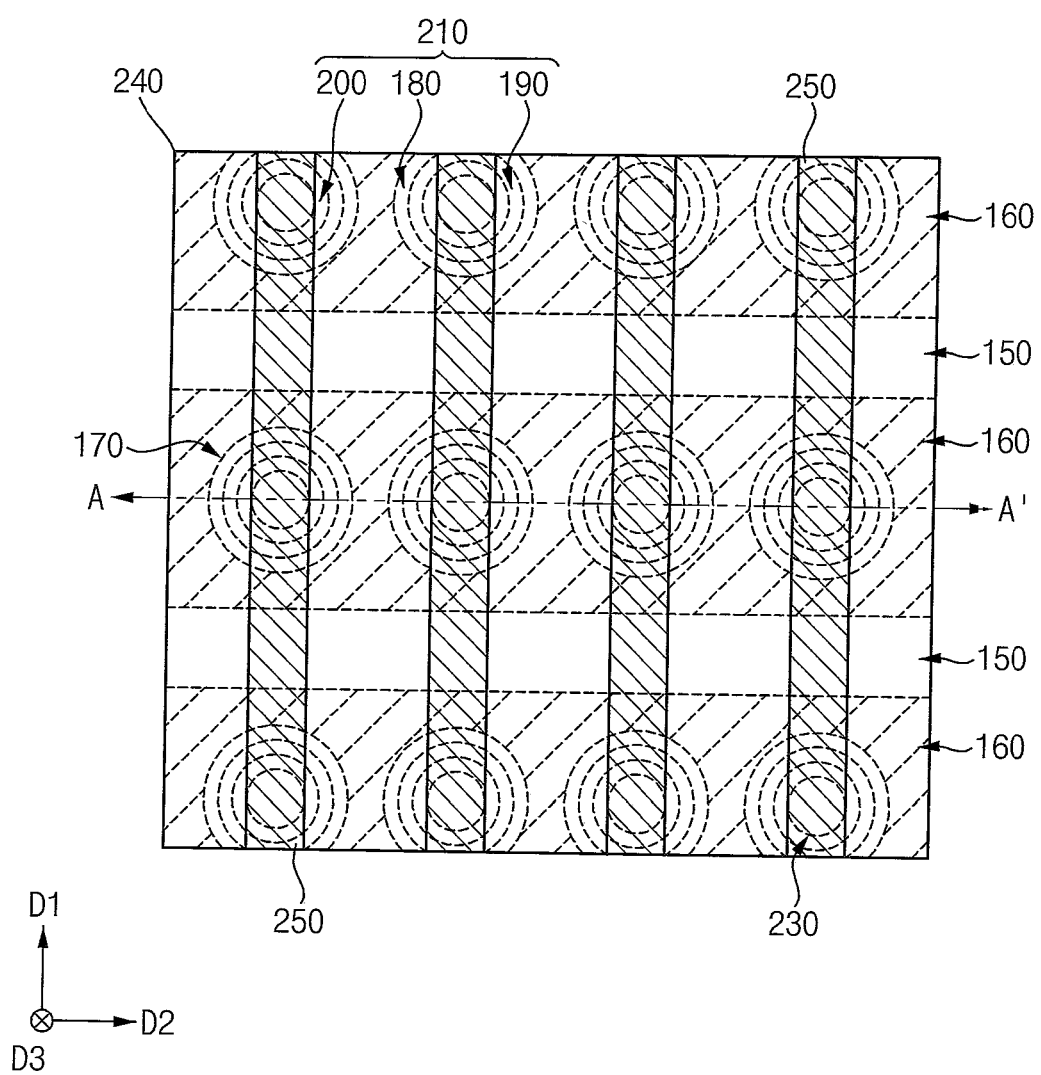
Figure 3:
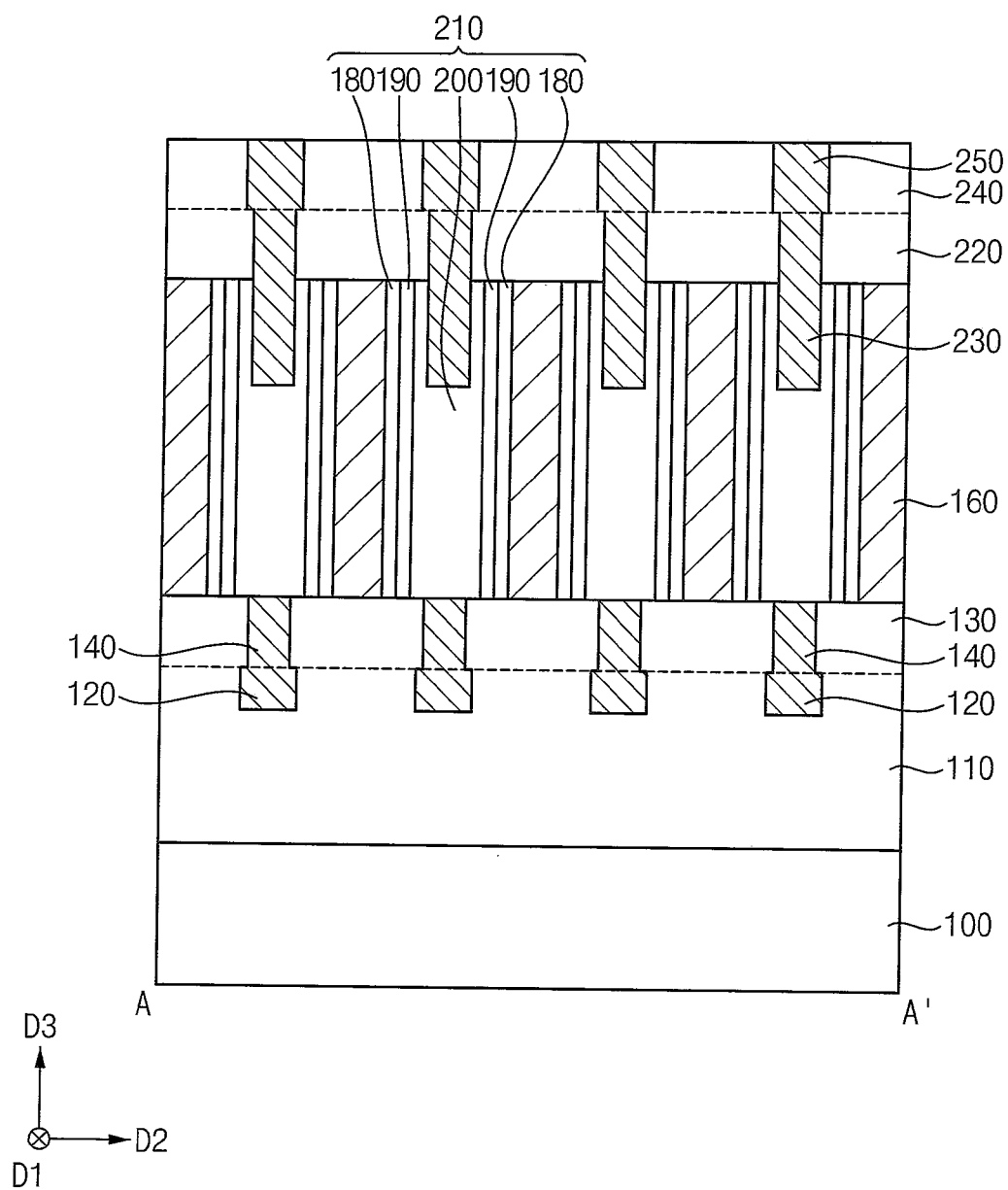

FIGS. 1 to 3 are a perspective view, a plan view and a cross-sectional view, respectively, illustrating a semiconductor device in accordance with example embodiments. FIG. 3 is a cross-sectional view taken along line A-A' of FIG. 2.

In FIG. 1, first to fifth insulating interlayers 110, 130, 150, 220 and 240 are not shown in order to avoid the complexity of drawing, and FIGS. 1 to 3 show only some portions of the semiconductor device.

Referring to FIGS. 1 to 3, the semiconductor device may include first and second wirings 120 and 250, first and second plugs 140 and 230, a gate electrode 160, a memory body structure 210, and the first to fifth insulating interlayers 110, 130, 150, 220 and 240 on a substrate 100.

The substrate 100 may include or may be formed of a semiconductor material, e.g., silicon, germanium, silicon-germanium, etc., or a III-V group compound semiconductor, such as GaP, GaAs, GaSb, etc. In an example embodiment, the substrate 100 may be a silicon-on-insulator (SOI) substrate or a germanium-on-insulator (GOI) substrate.

The first insulating interlayer 110 may be formed on the substrate 100, and may include or may be formed of oxide, e.g., silicon oxide.

The first wiring 120 may be buried in an upper portion of the first insulating interlayer 110. In example embodiments, the first wiring 120 may extend in the first direction D1, and a plurality of first wirings 120 may be spaced apart from each other in the second direction D2.

In example embodiments, the first wiring 120 may serve as a bit line of the semiconductor device. The first wiring 120 may include or may be formed of a conductive material, e.g., metal, a metal nitride, a metal silicide, etc.

The second insulating interlayer 130 may be formed on the first insulating interlayer 110 and the first wirings 120, and may include or may be formed of oxide, e.g., silicon oxide. In an example embodiment, the second insulating interlayer 130 may include or may be formed of a material substantially the same as that of the first insulating interlayer 110, and thus may be merged thereto.

The first plug 140 may extend in the third direction D3 through the second insulating interlayer 130 to contact an upper surface of each of the first wirings 120. In example embodiments, a plurality of first plugs 140 may be spaced apart from each other in the first direction D1 on each of the first wirings 120. As the plurality of first wirings 120 are spaced apart from each other in the second direction D2, a plurality of first plugs 140 may be spaced apart from each other in the first and second directions D1 and D2. The term "contact," as used herein, refers to a direct connection (i.e., touching) unless the context indicates otherwise.]

In example embodiments, the first plug 140 may serve as a drain of the semiconductor device, and thus may also be referred to as a drain layer. The first plug 140 may include or may be formed of metal or a metal alloy. In an example embodiment, the first plug 140 may include or may be formed of metal or a metal alloy having a work function equal to or less than about 3.8 eV. In an example embodiment, the first plug 140 may include or may be formed of a material substantially the same as that of the first wiring 120, and thus may be merged thereto.

The third insulating interlayer 150 may be formed on the second insulating interlayer 130 and the first plugs 140, and may include or may be formed of oxide, e.g., silicon oxide. In an example embodiment, the third insulating interlayer 150 may include or may be formed of a material substantially the same as that of the second insulating interlayer 130, and thus may be merged thereto.

The gate electrode 160 may be formed on the second insulating interlayer 130 through the third insulating interlayer 150. In example embodiments, the gate electrode 160 may extend in the second direction D2 on the first plugs 140 disposed in the second direction D2, and a plurality of gate electrodes 160 may be spaced apart from each other in the first direction D1.

Each of the gate electrodes 160 may extend in the second direction D2, and may serve as a word line of the semiconductor device. The gate electrode 160 may include or may be formed of a conductive material, e.g., metal, a metal nitride, a metal silicide, etc.

The memory body structure 210 may extend through the gate electrode 160 to contact an upper surface of the first plug 140. As the plurality of first plugs 140 are spaced apart from each other in the first and second directions D1 and D2, a plurality of memory body structures 210 may be spaced apart from each other in the first and second directions D1 and D2.

In example embodiments, the memory body structure 210 may include a body 200 having a pillar shape extending in the third direction D3, and a charge storage pattern 190 and a blocking pattern 180 stacked on a sidewall of the body 200 in a horizontal direction substantially parallel to an upper surface of the substrate 100. In an embodiment, the body 200, the charge storage pattern 190, and the blocking pattern 180 may be concentrically arranged. For example, the charge storage pattern 190 may surround a sidewall of the body 200, and the blocking pattern 180 may surround a sidewall of the charge storage pattern 190.

The body 200 may include or may be formed of, e.g., polysilicon, the charge storage pattern 190 may include or may be formed of an insulating nitride, e.g., silicon nitride, and the blocking pattern 180 may include or may be formed of silicon oxide or a high-k dielectric material such as a metal oxide, e.g., hafnium oxide, zirconium oxide, etc.

The fourth insulating interlayer 220 may be formed on the third insulating interlayer 150, the gate electrodes 160 and the memory body structure 210, and may include or may be formed of oxide, e.g., silicon oxide. In an example embodiment, the fourth insulating interlayer 220 may include or may be formed of a material substantially the same as that of the third insulating interlayer 150, and thus may be merged thereto.

The second plug 230 may extend in the third direction D3 through the fourth insulating interlayer 220 and an upper portion of the body 200. As the plurality of memory body structures 210 each of which may include the body 200 are spaced apart from each other in the first and second directions D1 and D2, a plurality of second plugs 230 may be spaced apart from each other in the first and second directions D1 and D2.

In example embodiments, the second plug 230 may have a width less than a width of the body 200, and the second plug 230 may extend through a central upper portion of the body 200. Thus, a portion of the body 200 may be interposed between the second plug 230 and the charge storage pattern 190. In an embodiment, the second plug 230 may include a buried portion that is buried in the central upper portion of the body 200, and the other portion of the second plug 230 may protrude upwardly from the central upper portion of the body 200 to contact a bottom surface of the second wiring 250.

In example embodiments, the second plug 230 may serve as a source of the semiconductor device, and thus may also be referred to as a source layer. In example embodiments, the second plug 230 may include or may be formed of silicon-germanium doped with p-type impurities.

The fifth insulating interlayer 240 may be formed on the fourth insulating interlayer 220 and the second plugs 230, and may include or may be formed of oxide, e.g., silicon oxide. In an example embodiment, the fifth insulating interlayer 240 may include or may be formed of a material substantially the same as that of the fourth insulating interlayer 220, and thus may be merged thereto.

The second wiring 250 may be formed on the fourth insulating interlayer 220 through the fifth insulating interlayer 240. In example embodiments, the second wiring 250 may extend in the first direction D1 to contact upper surfaces of the second plugs 230 disposed in the first direction D1, and a plurality of second wirings 250 may be spaced apart from each other in the second direction D2.

In example embodiments, each of the second wirings 250 may serve as a source line of the semiconductor device. The second wiring 250 may include or may be formed of a material substantially the same as that of the second plug 230, that is, germanium doped with p-type impurities. Thus, in some embodiments, the second plug 230 may be merged to the second wiring 250.

The semiconductor device may include a tunnel field effect transistor (TFET) having the body 200 including undoped polysilicon, the source layer 230 at an end portion of the body 200, the drain layer 140 at another end portion of the body 200, which may include or may be formed of metal and serve as an n-type drain, and the gate electrode 160 surrounding the body 200.

Additionally, the semiconductor device may include the charge storage pattern 190 between the gate electrode 160 and the body 200, and electrons or holes may be stored in the charge storage pattern 190 so that program and erase operations may be performed. Thus, unlike a 1T-1C DRAM including one transistor and one capacitor, the semiconductor device may be a 1T-DRAM including one TFET with no separate capacitor. One TFET and one charge storage pattern 190 may form a unit cell.

In example embodiments, the source layer 230 may include or may be formed of germanium doped with p-type impurities, and germanium has a bandgap energy of about 0.7 eV, which is less than a bandgap energy of silicon, that is, about 1.1 eV. Thus, when compared to a source layer including silicon, a band width from the source layer 230 to the body 200 may decrease so that a band to band tunneling may increase. As a result, an on-current of the semiconductor device may increase.

In example embodiments, the source layer 230 may partially extend through an upper portion of the body 200, and thus a portion of the body 200 may be interposed between the source layer 230 and the charge storage pattern 190 in the horizontal direction. In an embodiment, the source layer 230 may include a buried portion that is buried in the upper portion of the body 200, and the portion of the body 200 may be interposed between the buried portion of the source layer 230 and the charge storage pattern 190 in the horizontal direction. When compared to a semiconductor device in which the source layer 230 is formed only at an end portion of the body 200 so that no portion of the body 200 is interposed between the source layer 230 and the charge storage pattern 190, a high electric field area in which charges may tunnel from the source layer 230 to the body 200 may increase. Accordingly, the band to band tunneling may increase so as to increase the on-current.

In example embodiments, the drain layer 140 may include or may be formed of metal or a metal alloy instead of n-type semiconductor material, which may have a work function less than about 3.8 eV.

Thus, for example, at a program state in which a high positive voltage is applied to the gate electrode 160 so that electrons are stored in the charge storage pattern 190, when the voltage of the gate electrode 160 gradually decreases so that holes are generated, even if the voltage of the gate electrode 160 decreases to a minus voltage, a Schottky barrier may be formed between the body 200 and the drain layer 140 so that no hole current may flow. That is, as the drain layer 140 includes or is formed of metal or a metal alloy having a low work function instead of n-type semiconductor material, the Schottky barrier may be formed for holes generated in the body 200 so that no reverse current may flow.

Figure 4:
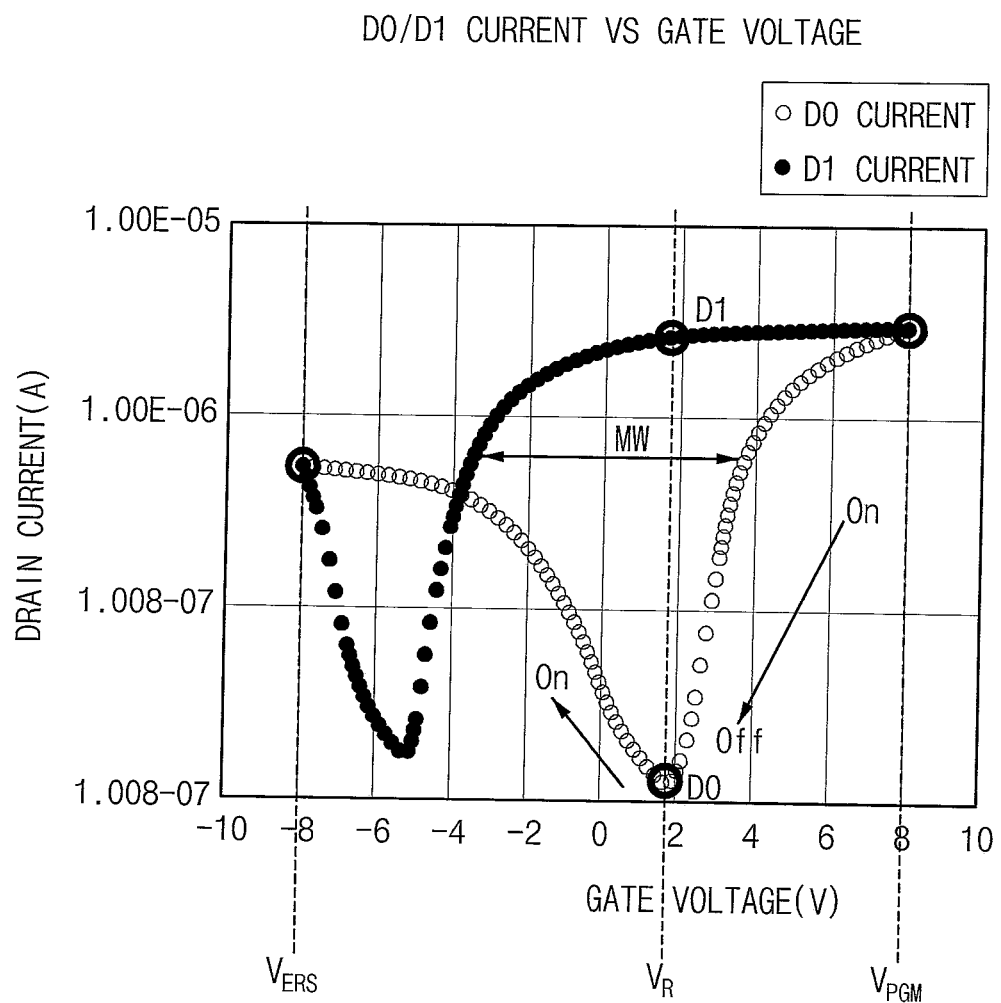
FIG. 4 is a graph illustrating a drain current according to a voltage applied to a gate electrode during program and erase operations in the conventional TFET.
Figure 5:
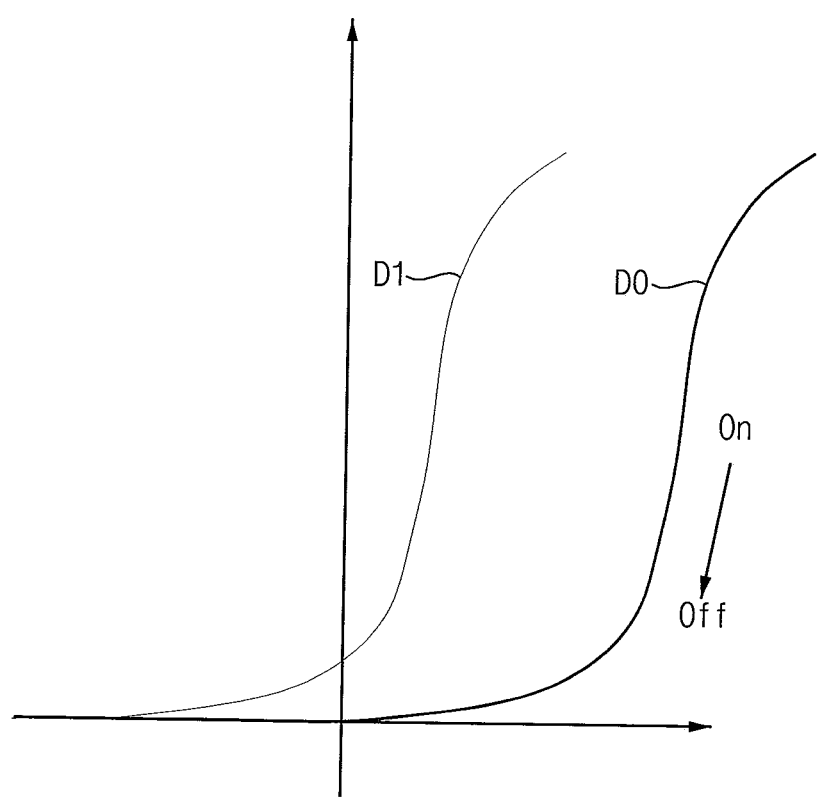
FIG. 5 is a graph illustrating a drain current according to a voltage applied to a gate electrode during program and erase operations in accordance with example embodiments.

FIG. 4 is a graph illustrating a drain current according to a voltage applied to a gate electrode during program and erase operations in the conventional TFET, and FIG. 5 is a graph illustrating a drain current according to a voltage applied to a gate electrode during program and erase operations in accordance with example embodiments.

In FIGS. 4 and 5, D0 represents a current flowing in the body during a program operation, and D1 represents a current flowing in the body during an erase operation.

Referring to FIG. 4, in the conventional TFET having a drain layer including polysilicon doped with n-type impurities, during each of the program and erase operations, a current-voltage curve (I-V curve) is an ambipolar curve in which the current increases when the voltage increases or decreases from a given value.

Referring to FIG. 5, in the TFET having the drain layer 140 including metal or a metal alloy having a work function equal to or less than about 3.8 eV, during each of the program and erase operations, a current-voltage curve (I-V curve) is a unipolar curve in which the current increases only when the voltage increases.

As illustrated above, in the semiconductor device in accordance with example embodiments, the source layer 230 may include or may be formed of germanium having a small bandgap energy and extend through a portion of the body 200, so that the on-current may increase and the operation speed of the semiconductor may increase. Additionally, the ratio of on-current with respect to the off-current may increase so that the sensing margin may increase. Furthermore, as the I-V curve is unipolar, the disturbance between neighboring cells may decrease so that the sensing margin may further increase.

The semiconductor device may be a cross-point array memory device having unit cells at respective areas where the bit lines 120 and the source lines 250 cross each other.

The semiconductor device may include the bit lines 120, each of which may extend in the first direction D1, spaced apart from each other in the second direction D2, the gate electrodes 160, each of which may extend in the second direction D2, spaced apart from each other in the first direction D1 on the bit lines 120, the source lines 250, each of which may extend in the first direction D1, spaced apart from each other in the second direction D2 on the gate electrodes 160, the memory body structures 210, each of which may extend through a corresponding one of the gate electrodes 160 in the third direction D3, spaced apart from each other in the second direction D2 in the corresponding one of the gate electrodes 160, the source layers 230 each of which may be formed at an end portion of a corresponding one of the memory body structures 210 to partially extend through an upper portion of the body 200 in the corresponding one of the memory body structures 210 and contacting a corresponding one of the source lines 250, and the drain layers 140 each of which may be formed at an end portion of a corresponding one of the memory body structures 210 and contacting a corresponding one of the bit lines 120. Each of the memory body structures 210 may include the body 200 extending in the third direction D3, the charge storage pattern 190 on the sidewall of the body 200, and the blocking pattern 180 on the outer sidewall of the charge storage pattern 190.

FIGS. 1 to 3 show that the source lines 250 and the source layers 230 are formed over the bit lines 120 and the drain layers 140, however, the inventive concept may not be limited thereto. Thus, the bit lines 120 and the drain layers 140 may be formed over the source lines 250 and the source layers 230.

FIGS. 1 to 3 show that the TFET is a gate-all-around (GAA) type transistor, however, the inventive concept may not be limited thereto, and may be a planar TR or a double gate TR.

FIGS. 6 to 19 are plan views and cross-sectional views illustrating a method of manufacturing a semiconductor device in accordance with example embodiments. Particularly, FIGS. 6, 8, 10, 12, 14, 16 and 18 are the plan views, and FIGS. 7, 9, 11, 13, 15, 17 and 19 are cross-sectional views taken along lines A-A' of corresponding plan views, respectively.

Figure 6:
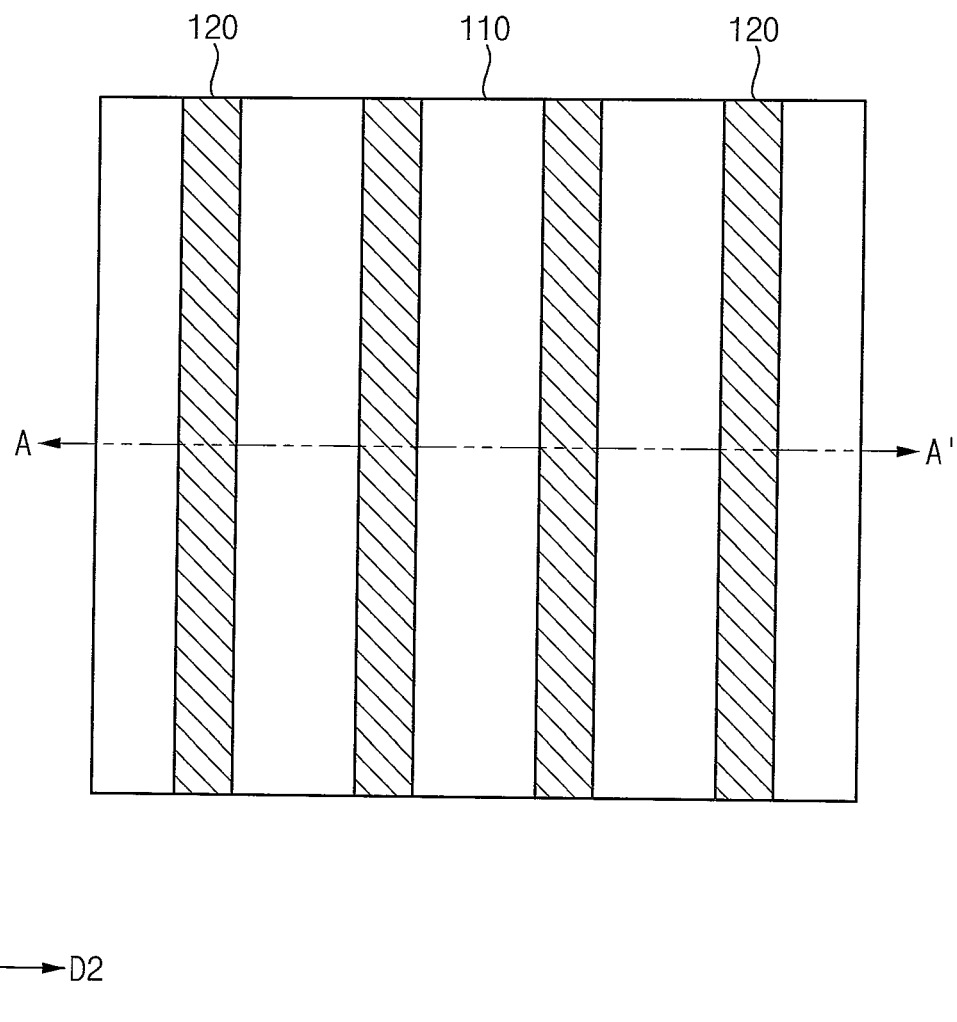
FIGS. 6 to 19 are plan views and cross-sectional views illustrating a method of manufacturing a semiconductor device in accordance with example embodiments.
Figure 7:
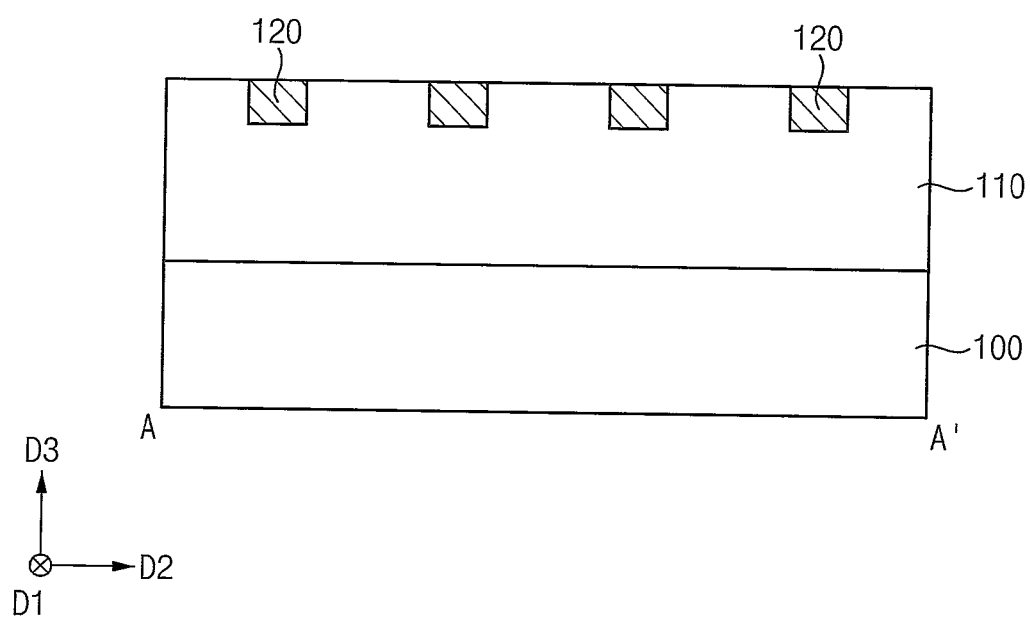

Referring to FIGS. 6 and 7, a first insulating interlayer 110 may be formed on a substrate 100, an upper portion of the first insulating interlayer 110 may be removed to form a first recess, and a first wiring 120 may be formed in the first recess.

The first wiring 120 may be formed by forming a first wiring layer on the first insulating interlayer 110 to fill the first recess, and planarizing an upper portion of the first wiring layer to expose an upper surface of the first insulating interlayer 110.

The planarization process may be performed by, e.g., a chemical mechanical polishing (CMP) process and/or an etch back process.

In example embodiments, the first wiring 120 may extend in the first direction D1, and a plurality of first wirings 120 may be spaced apart from each other in the second direction D2.

Figure 8:
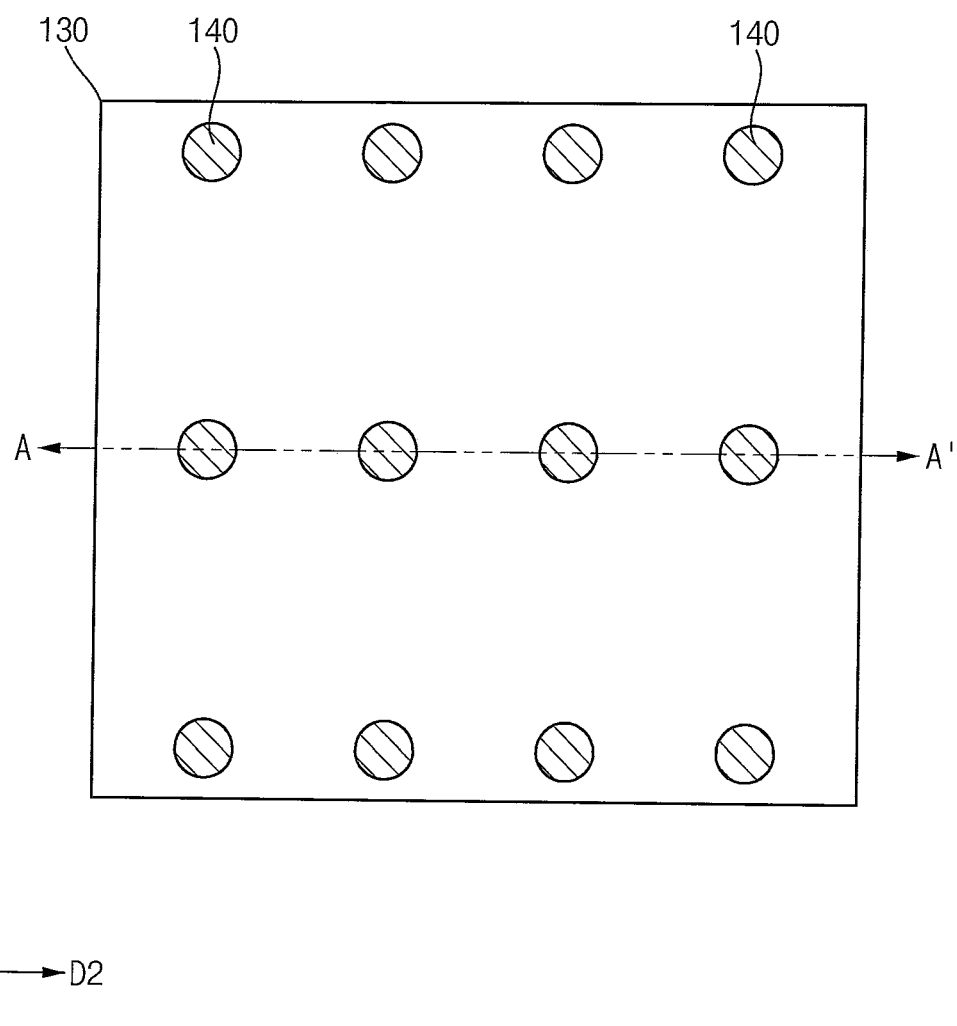
Figure 9:
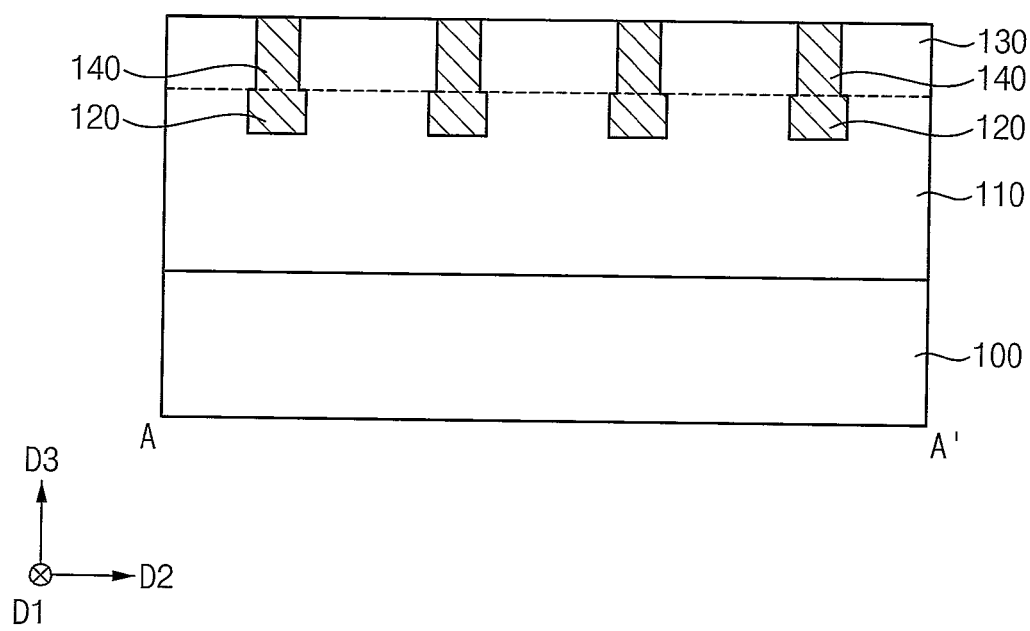

Referring to FIGS. 8 and 9, a second insulating interlayer 130 may be formed on the first insulating interlayer 110 and the first wirings 120, the second insulating interlayer 130 may be partially removed to form a first opening partially exposing an upper surface of each of the first wirings 120, and a first plug 140 may be formed in the first opening.

The first plug 140 may be formed by forming a first plug layer on the second insulating interlayer 130 and the first wiring 120 to fill the first opening, and planarizing the first plug layer to expose an upper surface of the second insulating interlayer 130.

In example embodiments, a plurality of first plugs 140 may be spaced apart from each other in the first direction D1 on each of the first wirings 120 extending in the first direction D1.

In an example embodiment, the second insulating interlayer 130 may include or may be formed of a material substantially the same as that of the first insulating interlayer 110, and thus may be merged thereto.

Figure 10:
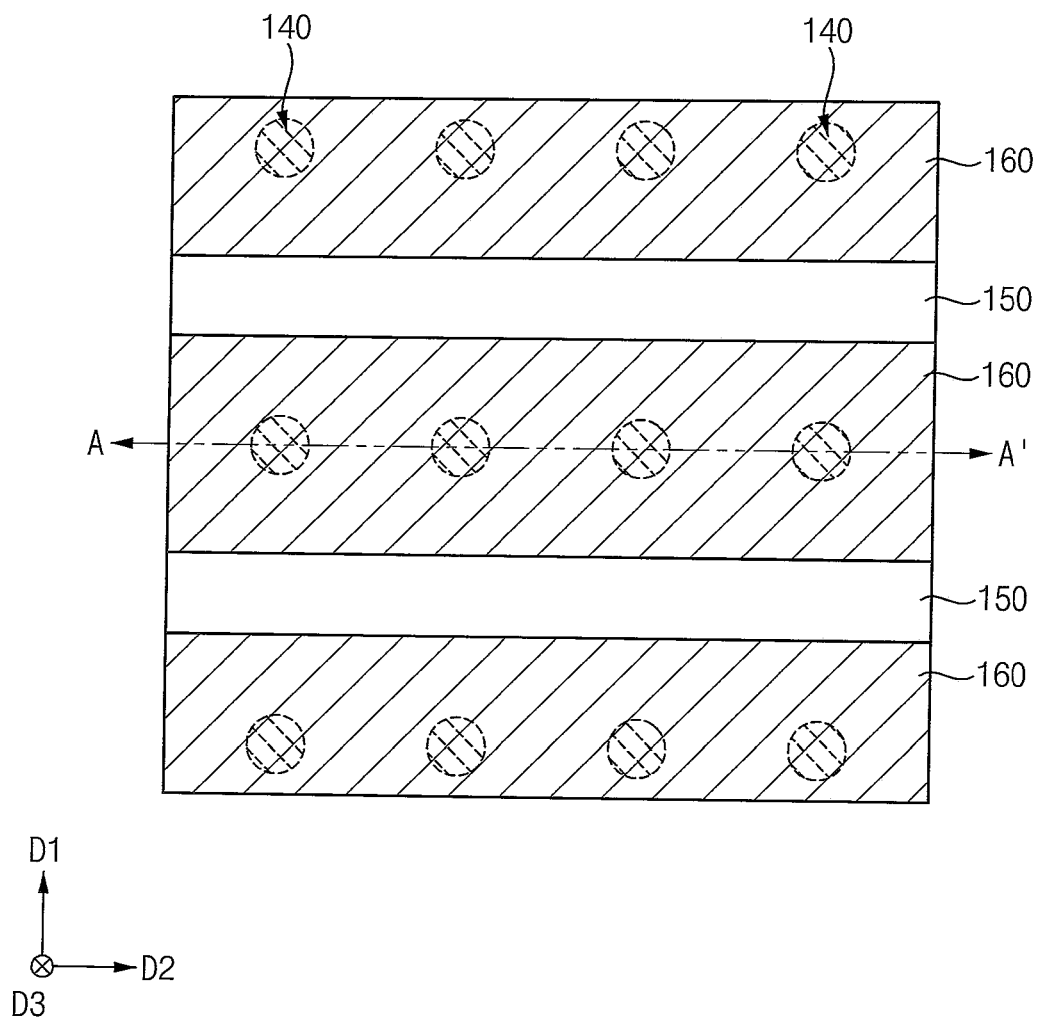
Figure 11:
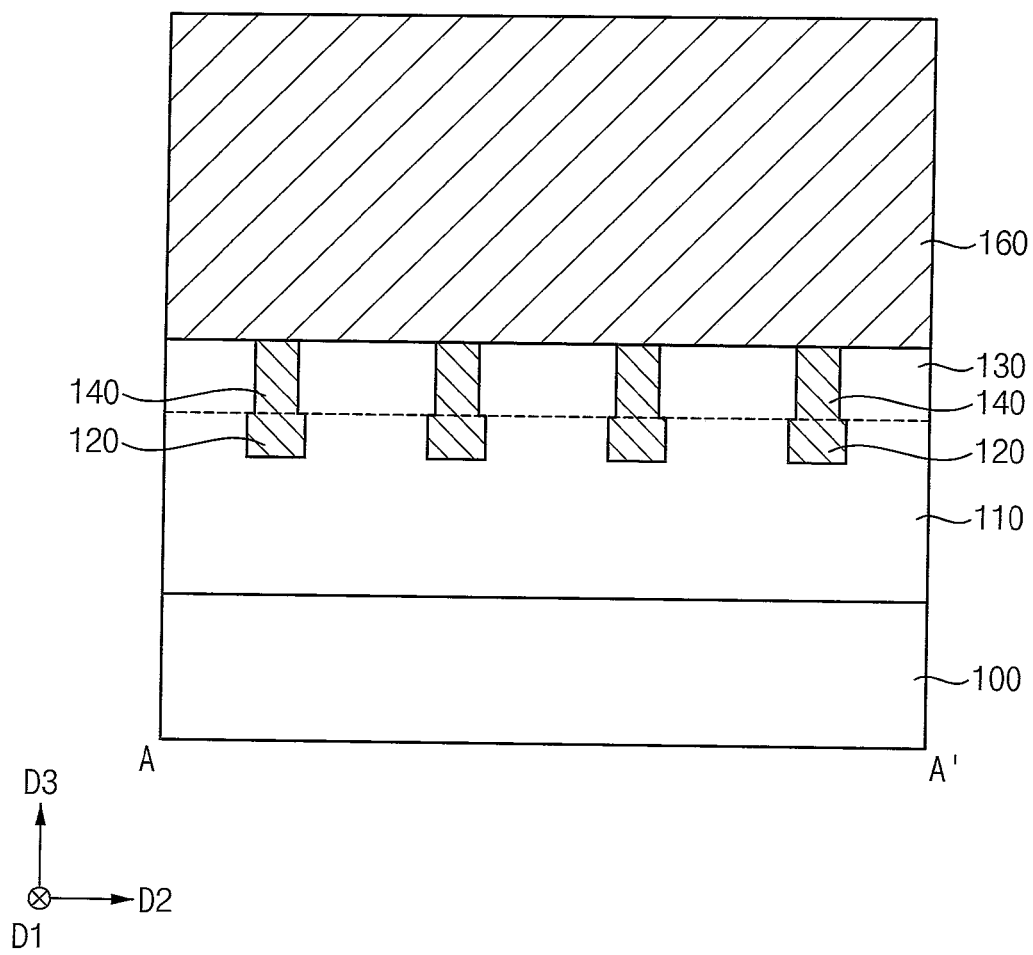

Referring to FIGS. 10 and 11, a third insulating interlayer 150 may be formed on the second insulating interlayer 130 and the first plugs 140, the third insulating interlayer 150 may be partially removed to form a second opening extending in the second direction D2 and exposing upper surfaces of the first plugs 140 and the second insulating interlayer 130, and a gate electrode 160 may be formed in the second opening.

The gate electrode 160 may be formed by forming a gate electrode layer on the third insulating interlayer 150, the first plugs 140 and the second insulating interlayer 130 to fill the second opening, and planarizing the gate electrode layer to expose an upper surface of the third insulating interlayer 150.

In example embodiments, the gate electrode 160 may extend in the second direction D2, and a plurality of gate electrodes 160 may be spaced apart from each other in the first direction D1.

Figure 12:
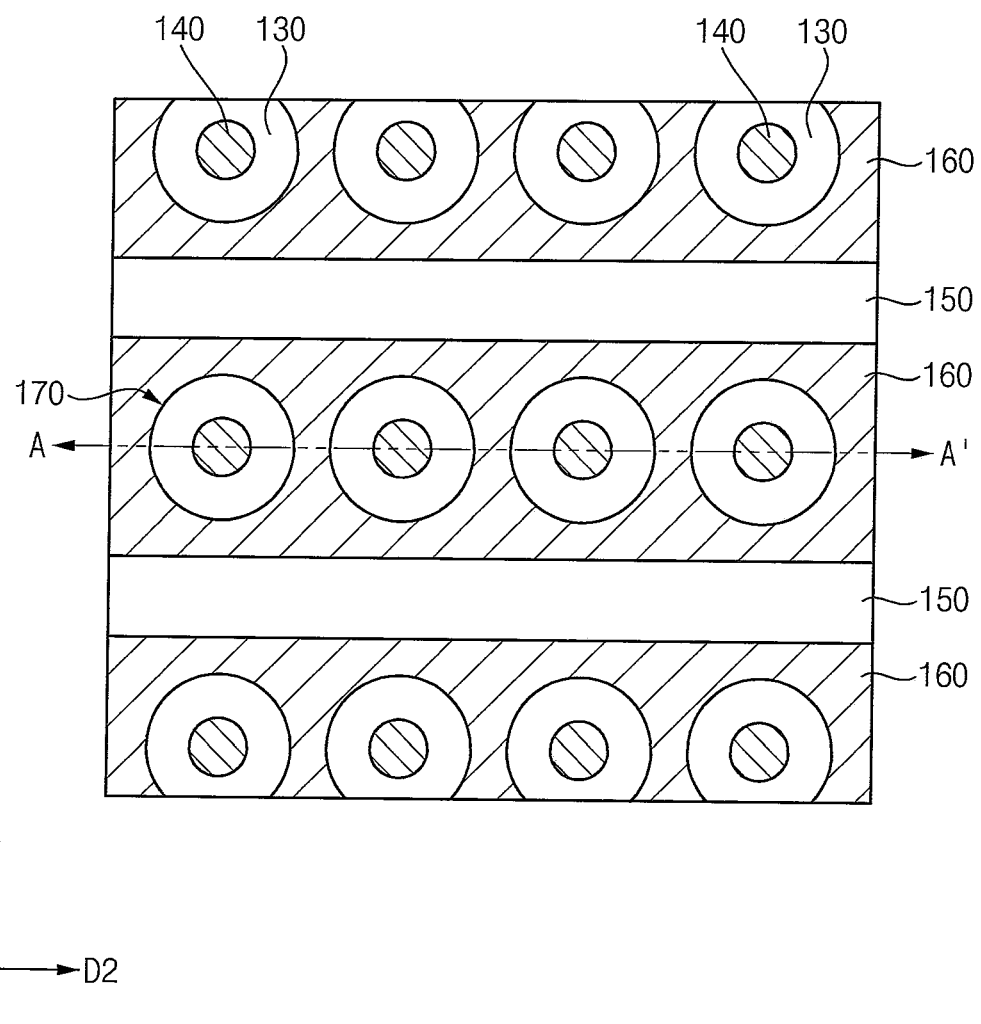
Figure 13:
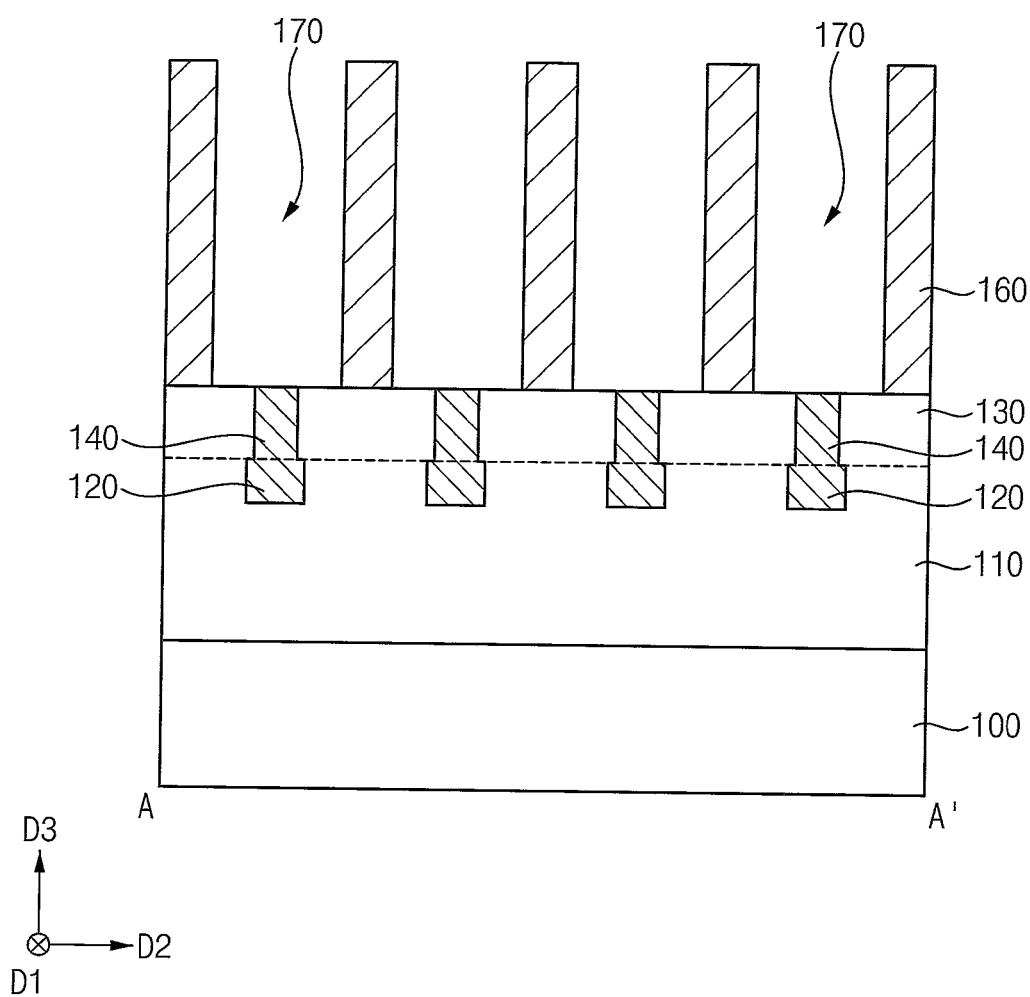

Referring to FIGS. 12 and 13, each of the gate electrodes 160 may be partially removed to form a third opening 170 exposing an upper surface of the first plug 140.

The third opening 170 may have a width greater than that of the first plug 140, and thus the third opening 170 may also expose an upper surface of a portion of the second insulating interlayer 130 adjacent to the first plug 140.

As the plurality of first plugs 140 are spaced apart from each other in the first direction D1 on each of the first wirings 120, a plurality of third openings 170 may be spaced apart from each other in the first direction D1 on each of the first wirings 120.

Figure 14:
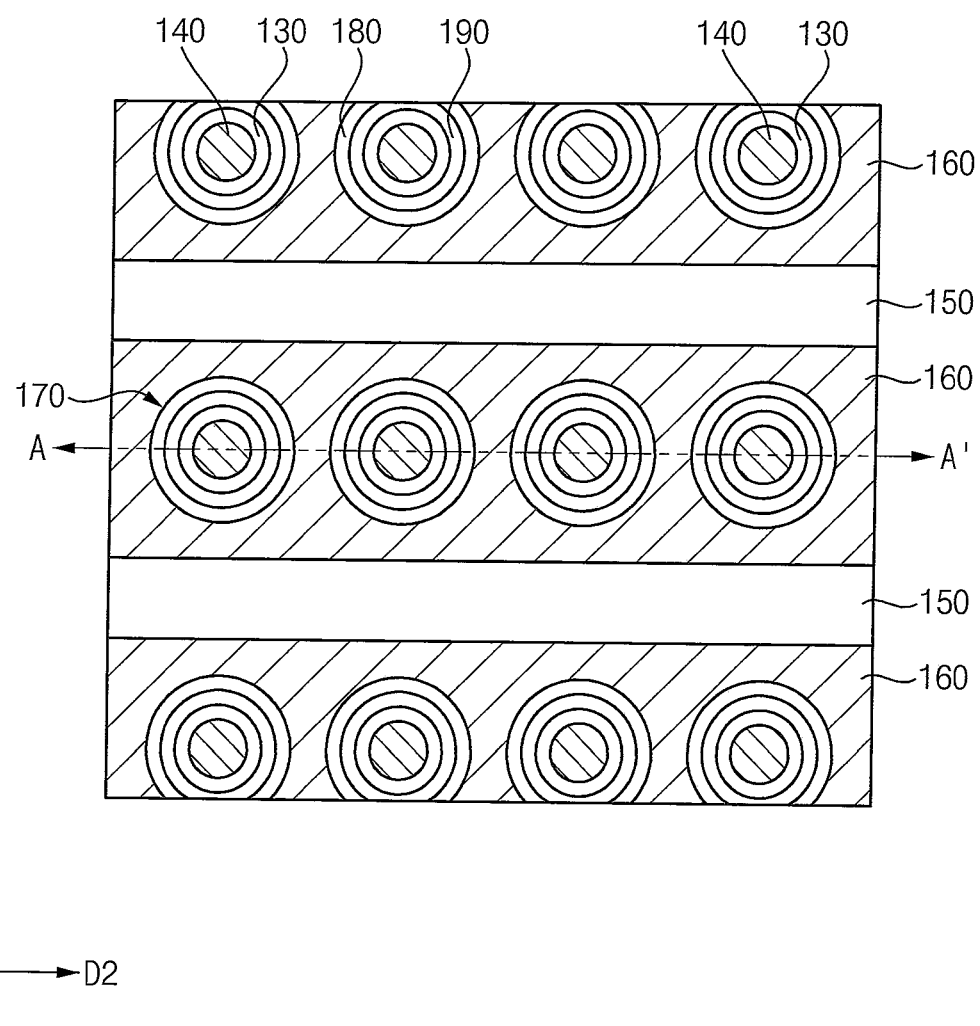
Figure 15:
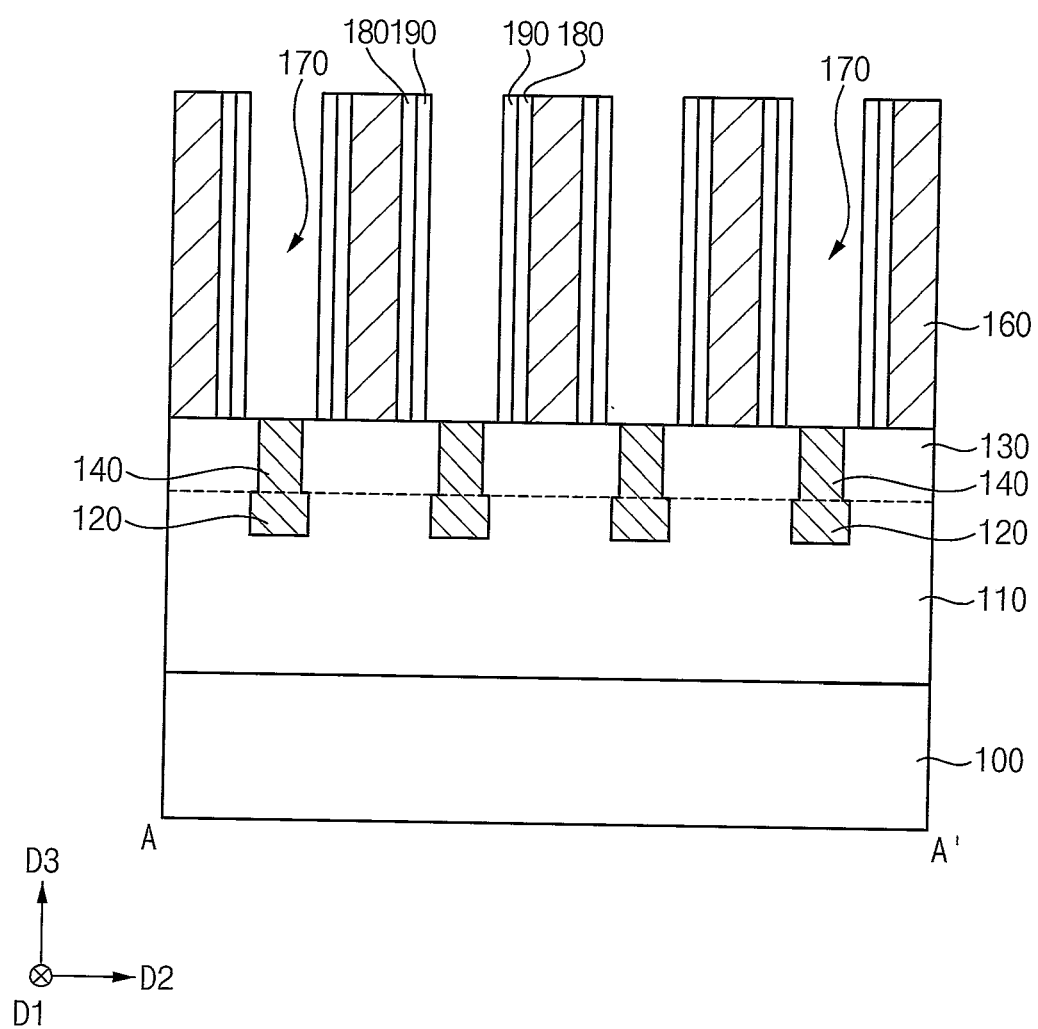

Referring to FIGS. 14 and 15, a blocking pattern 180 and a charge storage pattern 190 sequentially stacked on a sidewall of each of the third openings 170 may be formed.

The blocking pattern 180 may be formed by forming a blocking layer on the upper surfaces of the first plugs 140 and the second insulating interlayer 130 exposed by the third openings 170, sidewalls of the third openings 170, upper surfaces of the gate electrodes 160 and an upper surface of the third insulating interlayer 150, and anisotropically etching the blocking layer.

Likewise, the charge storage pattern 190 may be formed by forming a charge storage layer on the upper surfaces of the first plugs 140 and the second insulating interlayer 130 exposed by the third openings 170, inner sidewalls and upper surfaces of the blocking patterns 180, the upper surfaces of the gate electrodes 160 and the upper surface of the third insulating interlayer 150, and anisotropically etching the charge storage layer.

Figure 16:
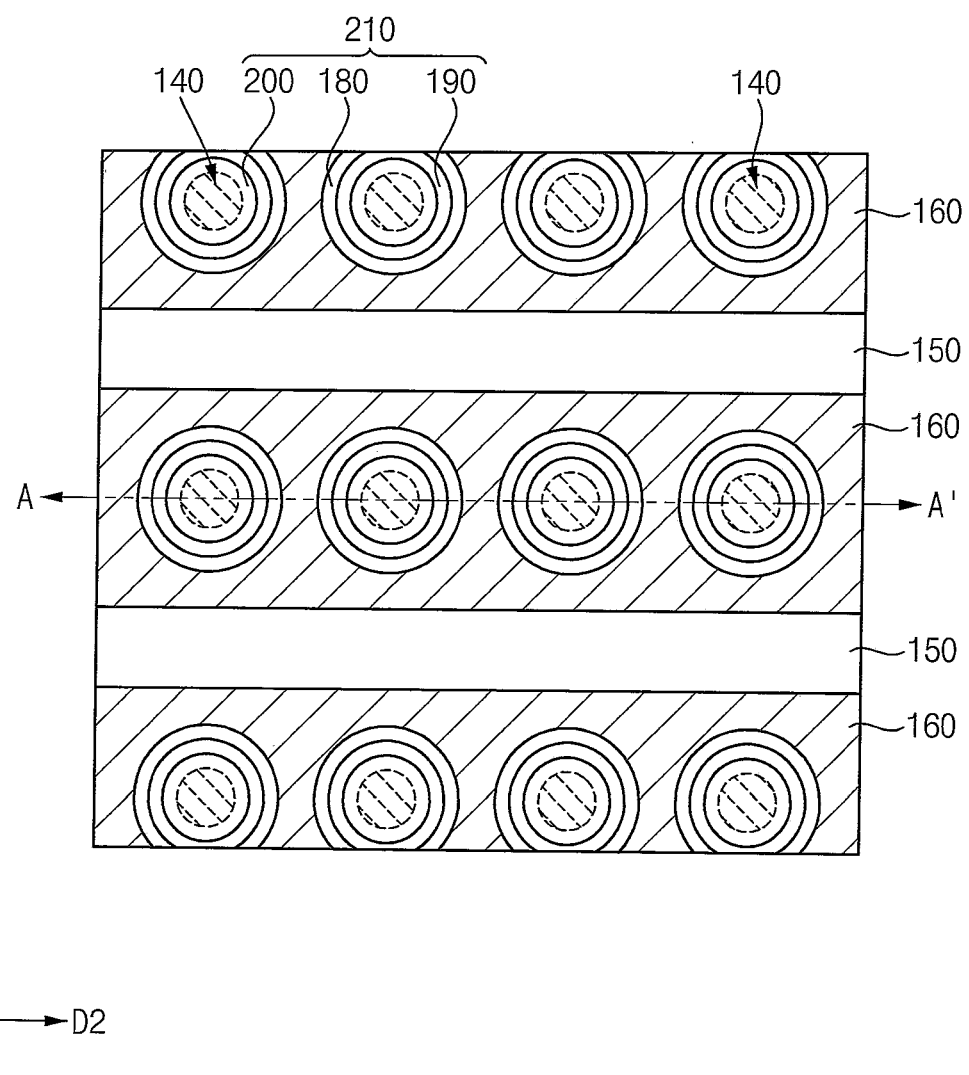
Figure 17:
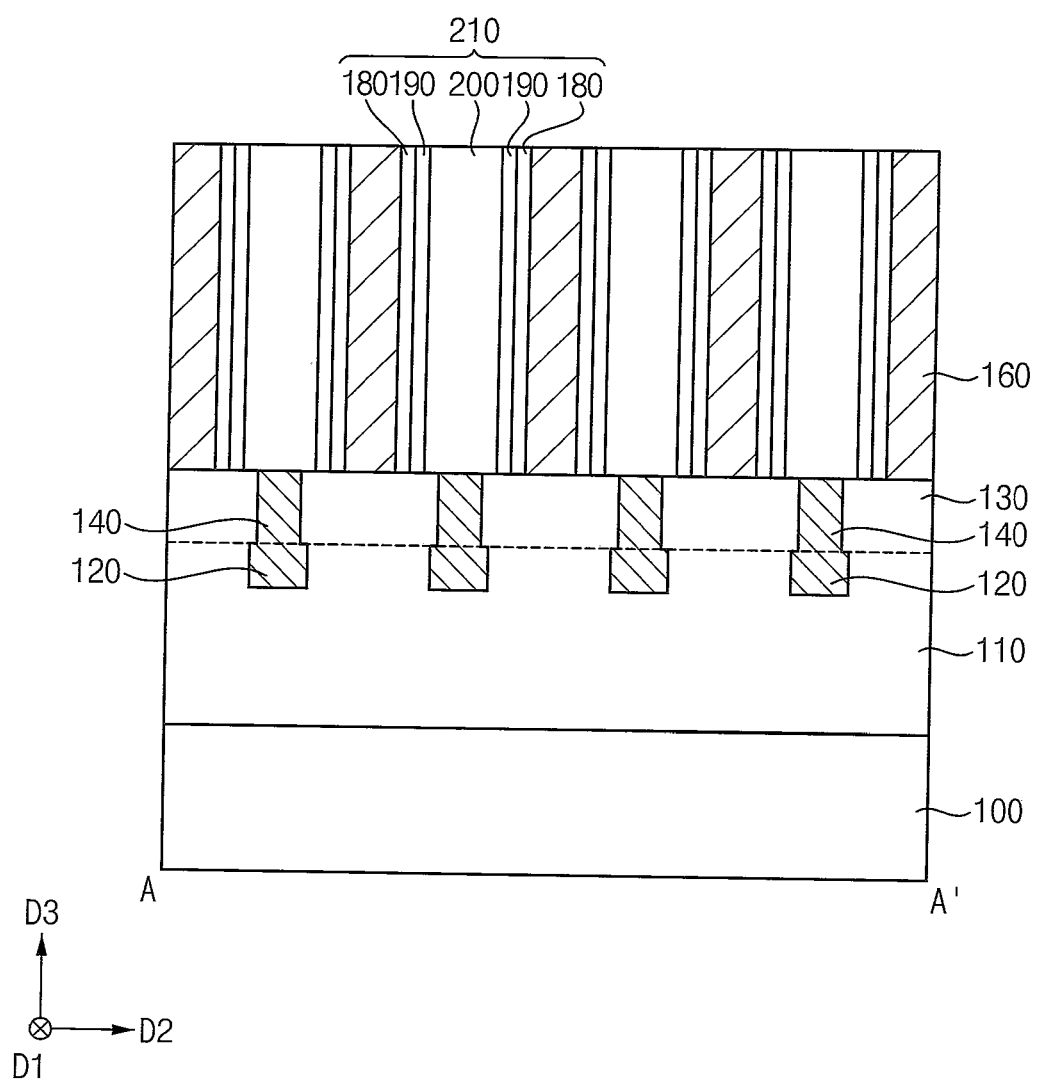

Referring to FIGS. 16 and 17, a body 200 may be formed to fill a remaining portion of each of the third openings 170.

The body 200 may be formed by forming a body layer on the upper surfaces of the first plugs 140 and the second insulating interlayer 130 exposed by the third openings 170, inner sidewalls and upper surfaces of the charge storage pattern 190, upper surfaces of the blocking patterns 180, the upper surfaces of the gate electrodes 160 and the upper surface of the third insulating interlayer 150, and planarizing the body layer to expose the upper surface of the third insulating interlayer 150.

The body 200 may be formed on each of the first plugs 140, and thus a plurality of bodies 200 may be spaced apart from each other in the first direction D1 on each of the first wirings 120.

The body 200, the charge storage pattern 190 and the blocking pattern 180 extending through the gate electrode 160 in each of the third openings 170 may form a memory body structure 210. In an embodiment, the body 200, the charge storage pattern 190, and the blocking pattern 180 may be concentric in the memory body structure 210.

Figure 18:
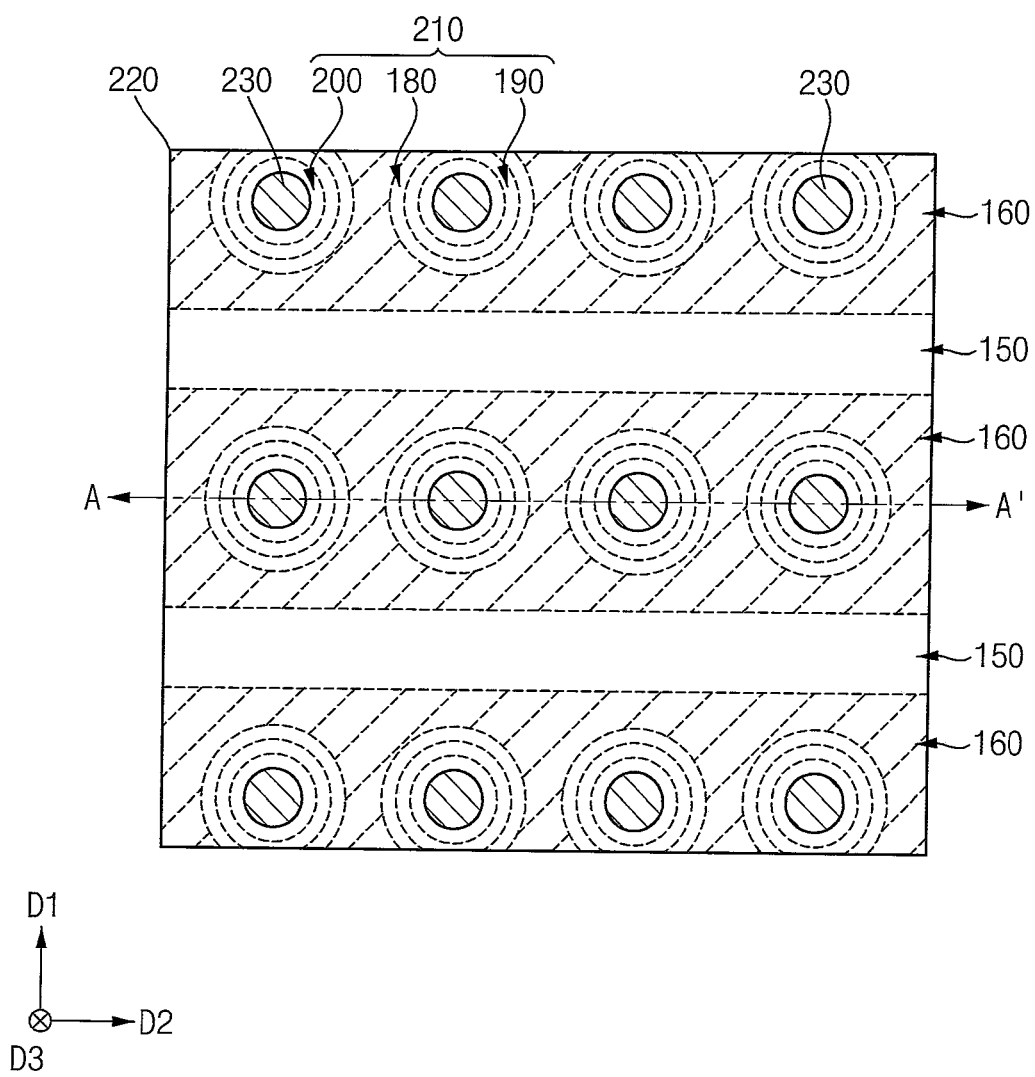
Figure 19:
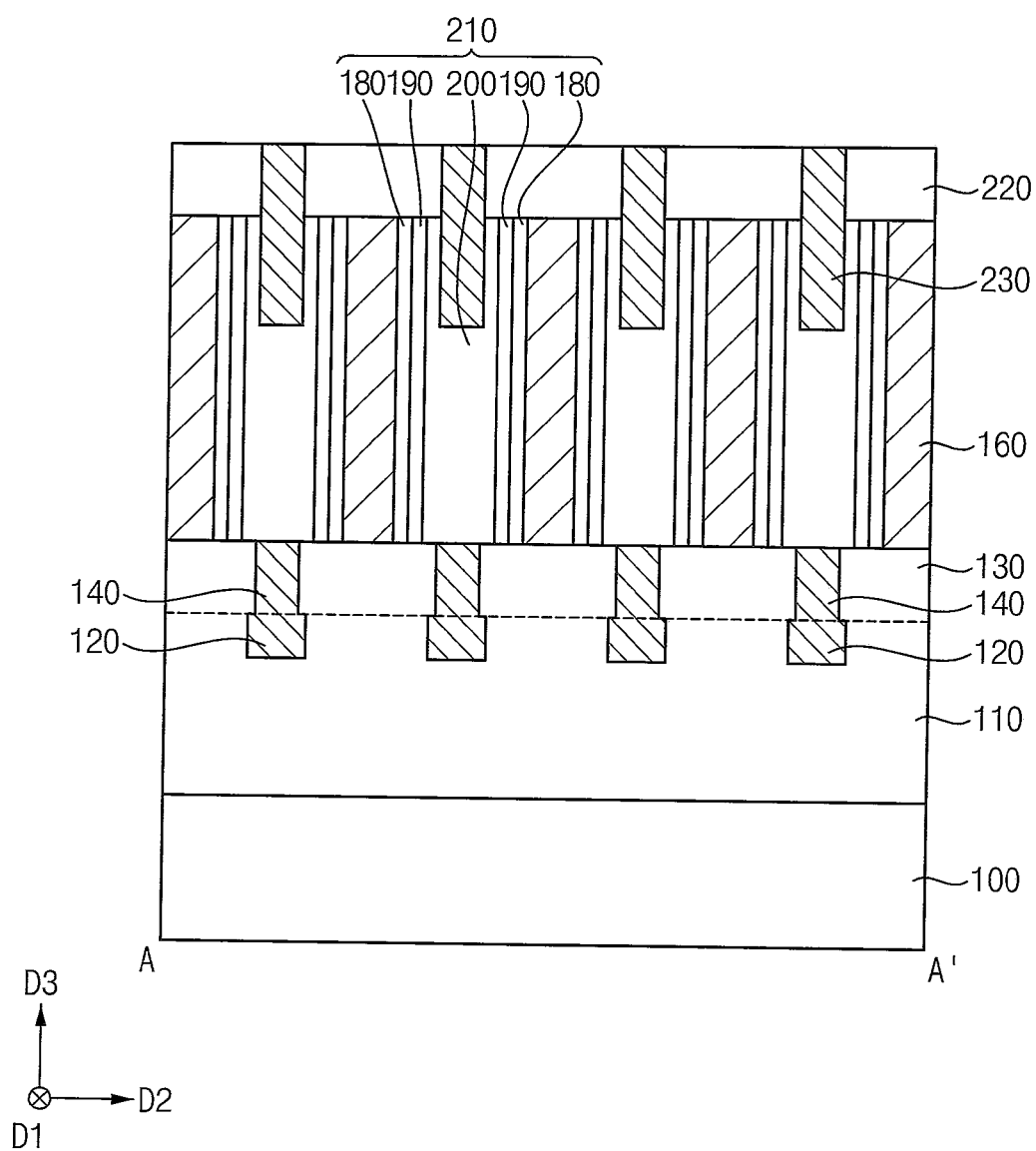

Referring to FIGS. 18 and 19, a fourth insulating interlayer 220 may be formed on the third insulating interlayer 150, the gate electrodes 160 and the memory body structure 210, the fourth insulating interlayer 220 may be partially removed to form a fourth opening exposing an upper surface of each of the bodies 200, further removing an upper portion of each of the bodies 200 to enlarge the fourth opening downwardly, and a second plug 230 may be formed in the enlarged fourth opening.

In example embodiments, the fourth opening may have a width less than that of a corresponding one of the bodies 200, and thus, the fourth opening may not entirely expose an upper surface of the body 200 but may expose only a central upper surface of the body 200.

The second plug 230 may be formed by forming a second plug layer on the upper surfaces of the bodies 200 exposed by the fourth openings and an upper surface of the fourth insulating interlayer 220, and planarizing the second plug layer to expose the upper surface of the fourth insulating interlayer 220.

The second plug 230 may be formed on each of the bodies 200, and thus a plurality of second plugs 230 may be spaced apart from each other in the first direction D1 on each of the first wirings 120. A lower portion of the second plug 230 may partially extend through an upper portion of the body 200, and may not contact an inner sidewall of the charge storage pattern 190 adjacent thereto but may be spaced apart from the inner sidewall of the charge storage pattern 190.

Referring to FIGS. 1 to 3, a fifth insulating interlayer 240 may be formed on the fourth insulating interlayer 220 and the second plugs 230, the fifth insulating interlayer 240 may be partially removed to form a fifth opening extending in the first direction D1 and exposing upper surfaces of the second plugs 230 and the upper surface of the fourth insulating interlayer 220, and a second wiring 250 may be formed in the fifth opening.

The second wiring 250 may be formed by forming a second wiring layer on the fifth insulating interlayer 240 and the second plugs 230 to fill the fifth opening, and planarizing the second wiring layer to expose an upper surface of the fifth insulating interlayer 240.

In example embodiments, the second wiring 250 may extend in the first direction D1, and a plurality of second wirings 250 may be spaced apart from each other in the second direction D2. Each of the second wirings 250 may contact upper surfaces of the second plugs 230 spaced apart from each other in the first direction D1.

By the above processes, the semiconductor device may be manufactured.

Figure 20:
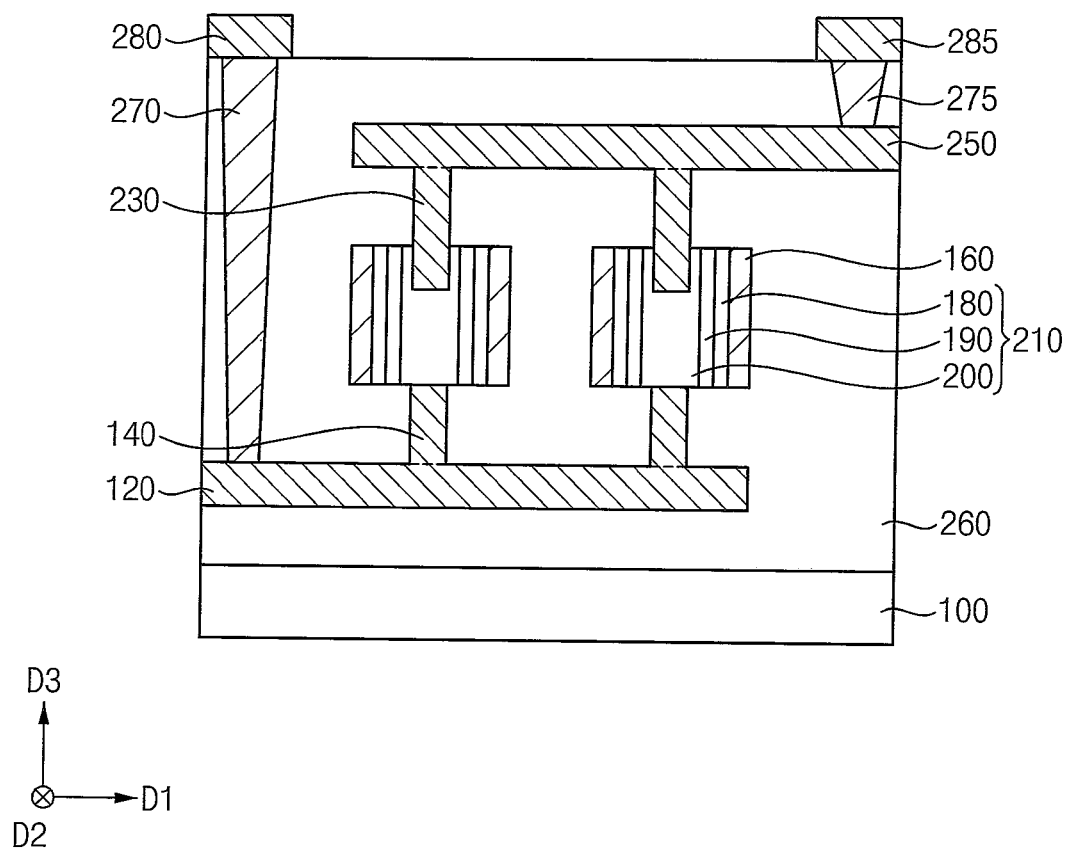
FIGS. 20 and 21 are cross-sectional views illustrating semiconductor devices in accordance with example embodiments.
Figure 21:
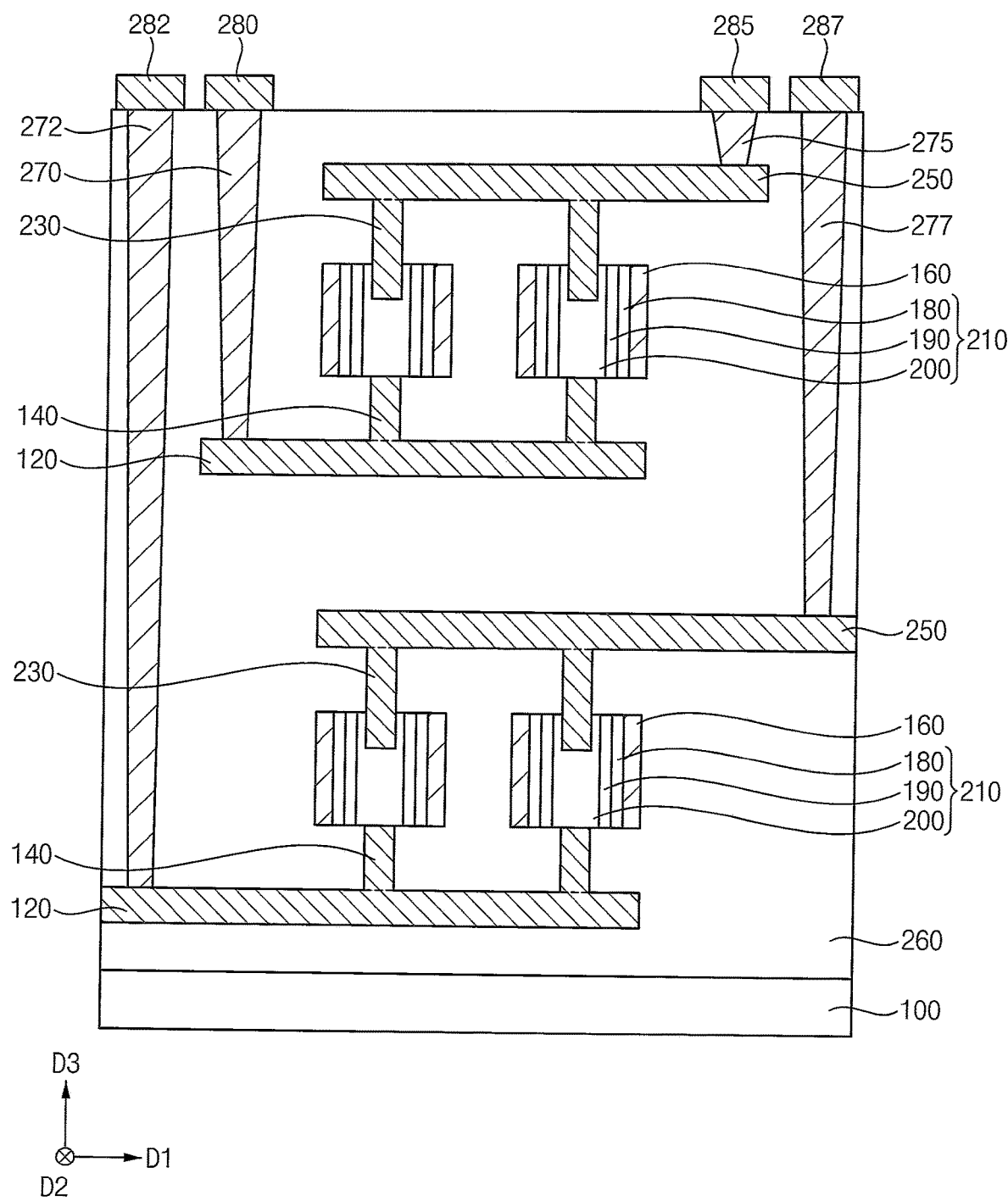

FIGS. 20 and 21 are cross-sectional views illustrating semiconductor devices in accordance with example embodiments, which are cross-sectional views taken along the first direction D1.

These semiconductor devices may include elements substantially the same as or similar to those of the semiconductor device shown in FIGS. 1 to 3, and repeated explanations thereof are omitted herein.

Referring to FIG. 20, the semiconductor device may further include first and second contact plugs 270 and 275 connected to the first and second wirings 120 and 250, respectively, and third and fourth wirings 280 and 285 connected to the first and second contact plugs 270 and 275, respectively.

The third wiring 280 may be electrically connected to the first wiring 120 through the first contact plug 270 contacting an upper surface of the first wiring 120, and may apply electrical signals to the first wiring 120. The fourth wiring 285 may be electrically connected to the second wiring 250 through the second contact plug 275 contacting an upper surface of the second wiring 250, and may apply electrical signals to the second wiring 250.

FIG. 20 shows that the first to fifth insulating interlayers 110, 130, 150, 220 and 240 are merged to form an insulating interlayer structure 260.

Referring to FIG. 21, two semiconductor devices each of which is shown in FIG. 20 are stacked in the third direction D3.

Third and fourth contact plugs 272 and 277 may be connected to the first and second wirings 120 and 250 in a lower one of the semiconductor devices, and fifth and sixth wirings 282 and 287 may be connected to the third and fourth contact plugs 272 and 277, respectively.

Thus, the fifth wiring 282 may be electrically connected to the first wiring 120 included in the lower one of the semiconductor devices through the third contact plug 272, and the sixth wiring 287 may be electrically connected to the second wiring 250 included in the lower one of the semiconductor devices through the fourth contact plug 277.

FIG. 21 show that two semiconductor devices are stacked in the third direction D3, however, the inventive concept may not be limited thereto, and a plurality of semiconductor devices may be stacked in the third direction D3.

While the inventive concept has been shown and described with reference to exemplary embodiments thereof, it will be apparent to those of ordinary skill in the art that various modifications in form and details may be made thereto without departing from the spirit and scope of the inventive concept as set forth by the following claims.

What is claimed is:

1. A semiconductor device, comprising:
   a gate electrode on a substrate;
   a memory body structure extending through the gate electrode;
   a source layer at an end portion of the memory body structure; and
   a drain layer at another end portion of the memory body structure,
   wherein the memory body structure includes:
      a body being a single layer including a semiconductor material;
      a charge storage pattern; and
      a blocking pattern on an outer sidewall of the charge storage pattern, the blocking pattern contacting the gate electrode,
   wherein the source layer includes a buried portion buried in the body, and
   wherein a portion of the body is interposed between the buried portion of the source layer and the charge storage pattern.

2. The semiconductor device of claim 1,
   wherein the body extends in a vertical direction substantially perpendicular to an upper surface of the substrate, and
   wherein the portion of the body is interposed between the buried portion of the source layer and the charge storage pattern in a horizontal direction substantially parallel to the upper surface of the substrate.

3. The semiconductor device of claim 1,
   wherein the body includes undoped polysilicon.

4. The semiconductor device of claim 1,
   wherein the source layer includes germanium doped with p-type impurities.

5. The semiconductor device of claim 1,
   wherein the drain layer includes metal or a metal alloy.

6. The semiconductor device of claim 5,
   wherein the drain layer includes metal or a metal alloy having a work function equal to or less than about 3.8 eV.

7. The semiconductor device of claim 1,
wherein the charge storage pattern includes silicon nitride, and the blocking pattern includes a metal oxide or silicon oxide.

8. The semiconductor device of claim 1, wherein:
the gate electrode extends in a second direction substantially parallel to an upper surface of the substrate,
the memory body structure is one of a plurality of memory body structures spaced apart from each other in the second direction,
the source layer is one of a plurality of source layers spaced apart from each other in the second direction, and
the drain layer is one of a plurality of drain layers spaced apart from each other in the second direction.

9. The semiconductor device of claim 1,
wherein the gate electrode extends in a second direction substantially parallel to an upper surface of the substrate,
wherein the gate electrode is one of a plurality of gate electrodes spaced apart from each other in a first direction substantially parallel to the upper surface of the substrate and crossing the second direction,
wherein the memory body structure is one of a plurality of memory body structures spaced apart from each other in the first and second directions,
wherein the source layer is one of a plurality of source layers spaced apart from each other in the first and second directions, and
wherein the drain layer is one of a plurality of drain layers spaced apart from each other in the first and second directions.

10. The semiconductor device of claim 9, further comprising:
a plurality of source lines spaced apart from each other in the second direction, each source line of the plurality of source lines extending in the first direction and contacting the plurality of source layers disposed in the first direction; and
a plurality of bit lines spaced apart from each other in the second direction, each bit line of the plurality of bit lines extending in the first direction and contacting the plurality of drain layers disposed in the first direction.

11. A semiconductor device, comprising:
a gate electrode on a substrate;
a memory body structure extending through the gate electrode;
a source layer at an end portion of the memory body structure, the source layer including germanium doped with p-type impurities; and
a drain layer at another end portion of the memory body structure, the drain layer including metal or a metal alloy,
wherein the memory body structure includes:
a body including undoped polysilicon;
a charge storage pattern on a sidewall of the body; and
a blocking pattern on an outer sidewall of the charge storage pattern, the blocking pattern contacting the gate electrode, and
wherein an upper surface of the charge storage pattern is coplanar with an upper surface of the body.

12. The semiconductor device of claim 11,
wherein the drain layer includes metal or a metal alloy having a work function equal to or less than about 3.8 eV.

13. The semiconductor device of claim 11,
wherein the body extends in a vertical direction substantially perpendicular to an upper surface of the substrate,
wherein the source layer includes a buried portion buried in the body, and
wherein a portion of the body is interposed between the buried portion of the source layer and the charge storage pattern in a horizontal direction substantially parallel to the upper surface of the substrate.

14. The semiconductor device of claim 11, wherein:
the gate electrode extends in a second direction substantially parallel to an upper surface of the substrate,
the memory body structure is one of a plurality of memory body structures spaced apart from each other in the second direction,
the source layer is one of a plurality of source layers spaced apart from each other in the second direction, and
the drain layer is one of a plurality of drain layers spaced apart from each other in the second direction.

15. The semiconductor device of claim 11,
wherein the gate electrode extends in a second direction substantially parallel to an upper surface of the substrate,
wherein the gate electrode is one of a plurality of gate electrodes spaced apart from each other in a first direction substantially parallel to the upper surface of the substrate and crossing the second direction,
wherein the memory body structure is one of a plurality of memory body structures spaced apart from each other in the first and second directions,
wherein the source layer is one of a plurality of source layers spaced apart from each other in the first and second directions, and
wherein the drain layer is one of a plurality of drain layers spaced apart from each other in the first and second directions.

16. The semiconductor device of claim 15, further comprising:
a plurality of source lines spaced apart from each other in the second direction, each source line of the plurality of source lines extending in the first direction and contacting the plurality of source layers disposed in the first direction; and
a plurality of bit lines spaced apart from each other in the second direction, each bit line of the plurality of bit lines extending in the first direction and contacting the plurality of drain layers disposed in the first direction.

17. A semiconductor device, comprising:
a plurality of bit lines on a substrate, each bit line of the plurality of bit lines extending in a first direction substantially parallel to an upper surface of the substrate, and the plurality of bit lines being spaced apart from each other in a second direction substantially parallel to the upper surface of the substrate and crossing the first direction;
a plurality of gate electrodes spaced apart from each other in the first direction on the plurality of bit lines, each gate electrode of the plurality of gate electrodes extending in the second direction;
a plurality of source lines spaced apart from each other in the second direction on the plurality of gate electrodes, each source line of the plurality of source lines extending in the first direction;
a plurality of memory body structures spaced apart from each other in the second direction, each memory body structure of the plurality of memory body structures extending through a corresponding gate electrode of the plurality of gate electrodes in a third direction substantially perpendicular to the upper surface of the substrate;

a plurality of source layers at first end portions of the plurality of memory body structures, respectively, each source layer of the plurality of source layers contacting a corresponding source line of the plurality of source lines; and a plurality of drain layers at second end portions of the plurality of memory body structures, respectively, each drain layer of the plurality of drain layers contacting a corresponding bit line of the plurality of bit lines, wherein each memory body structure of the plurality of memory body structures includes:
  a body extending in the third direction, the body being a single layer including a semiconductor material;
  a charge storage pattern on a sidewall of the body; and
  a blocking pattern on an outer sidewall of the charge storage pattern, wherein each source layer of the plurality of source layers includes a buried portion buried in an upper portion of a body of a corresponding memory body structure of the plurality of memory body structures, and wherein a portion of the body of the corresponding memory body structure is interposed between each of the plurality of source layers and the charge storage pattern on the sidewall of the body of the corresponding memory body structure of the plurality of memory body structures.

18. The semiconductor device of claim 17, further comprising:
  a first contact plug extending in the third direction and contacting an upper surface of each bit line of the plurality of bit lines;
  a first wiring electrically connected to the first contact plug;
  a second contact plug extending in the third direction and contacting an upper surface of each source line of the plurality of source lines; and
  a second wiring electrically connected to the second contact plug.

19. The semiconductor device of claim 17,
wherein the body includes undoped polysilicon, and
wherein each source layer of the plurality of source layers includes germanium doped with p-type impurities.

20. The semiconductor device of claim 19,
wherein each drain layer of the plurality of drain layers includes metal or a metal alloy.

* * * * *